United States Patent [19]

Wieser et al.

[11] 4,430,621
[45] Feb. 7, 1984

[54] CMOS POLARITY SWITCH

[75] Inventors: James B. Wieser; Suman H. Patel, both of Sunnyvale, Calif.

[73] Assignee: National Semiconductor Corporation, Santa Clara, Calif.

[21] Appl. No.: 265,876

[22] Filed: May 21, 1981

[51] Int. Cl.³ .............................................. H03F 3/45
[52] U.S. Cl. ...................................... 330/9; 307/262; 330/253; 330/260
[58] Field of Search ...................... 330/9, 51, 252, 253, 330/260; 307/262

[56] References Cited

U.S. PATENT DOCUMENTS 4,053,797 10/1977 Tosuntikool et al. .............. 307/262
4,209,753 6/1980 Riley ...................... 330/51

Primary Examiner—James B. Mullins
Attorney, Agent, or Firm—Gail W. Woodward; Paul J. Winters; Michael J. Pollock

[57] ABSTRACT

A linear differential amplifier is fabricated in CMOS and combined with digital control so that an analog input signal can be converted to a selected output polarity. When the amplifier output is coupled directly to the inverting input the noninverting input provides a unity gain voltage follower configuration. To create a unity gain signal inverter, a matched pair of resistors is employed. One resistor is coupled between the amplifier output and the inverting input while the other is coupled between the analog signal input and the inverting input. In operation digital control is employed in switching between the two configurations. The sense of the differential amplifier is reversed when switching between configurations thereby to provide a substantial reduction of the effect of offset potential. To fully compensate the offset pootential, a capacitor is periodically coupled across the amplifier input to charge it to the offset potential. Then an equal value capacitor is connected in parallel thus having the potential and the combination coupled to the noninverting amplifier input during the time when the inverting configuration is in operation. The same amplifier offset is present in both configurations, but in opposite polarities, and therefore produces equal, but opposite $V_{REF}$ switching through digital control.

4 Claims, 5 Drawing Figures

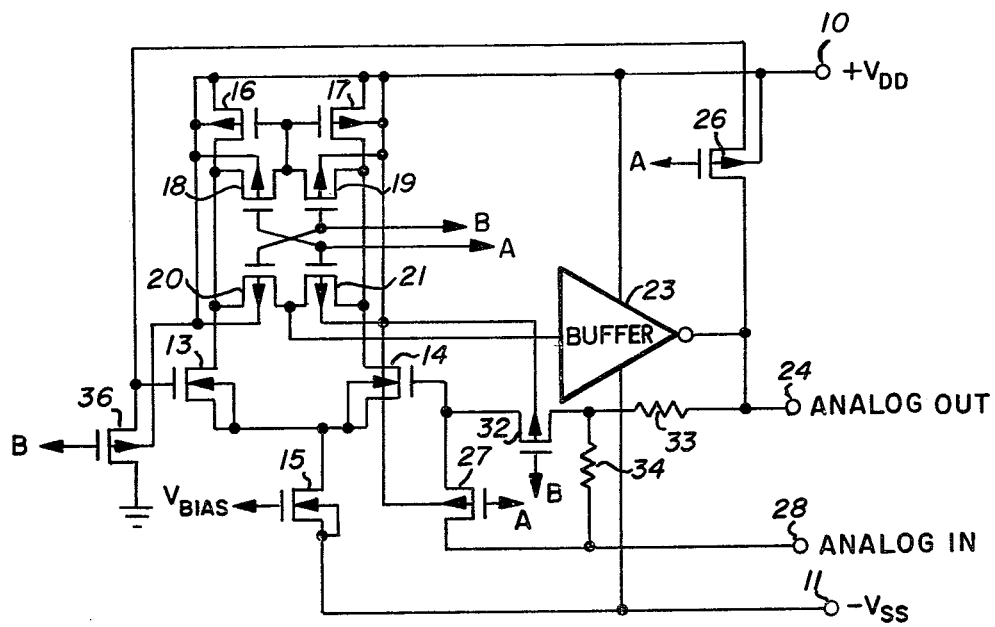
Fig_1
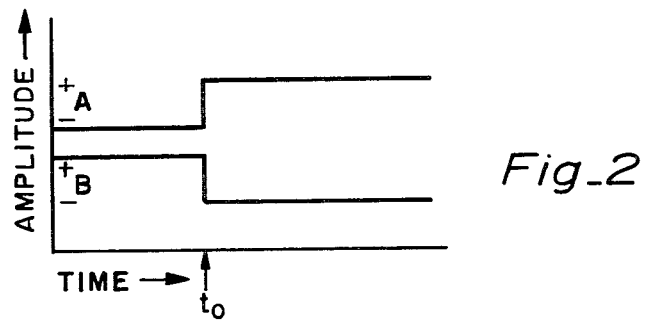
Fig_2
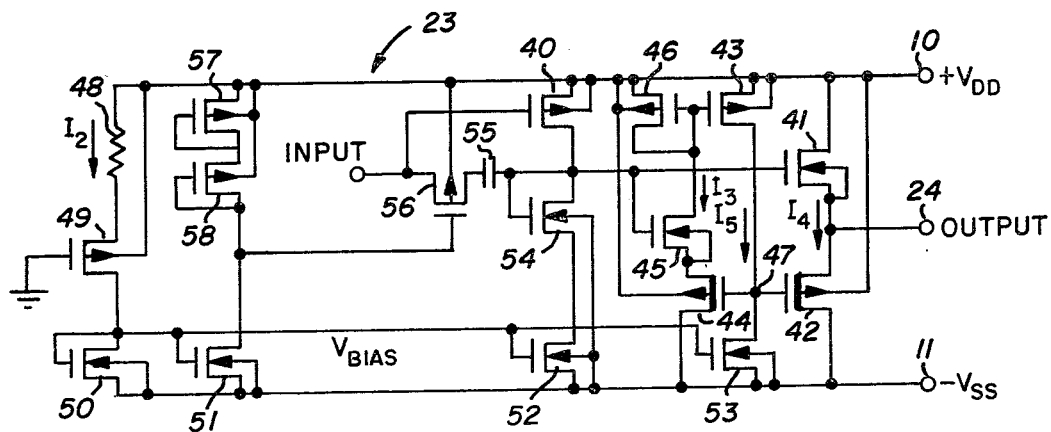
Fig_3

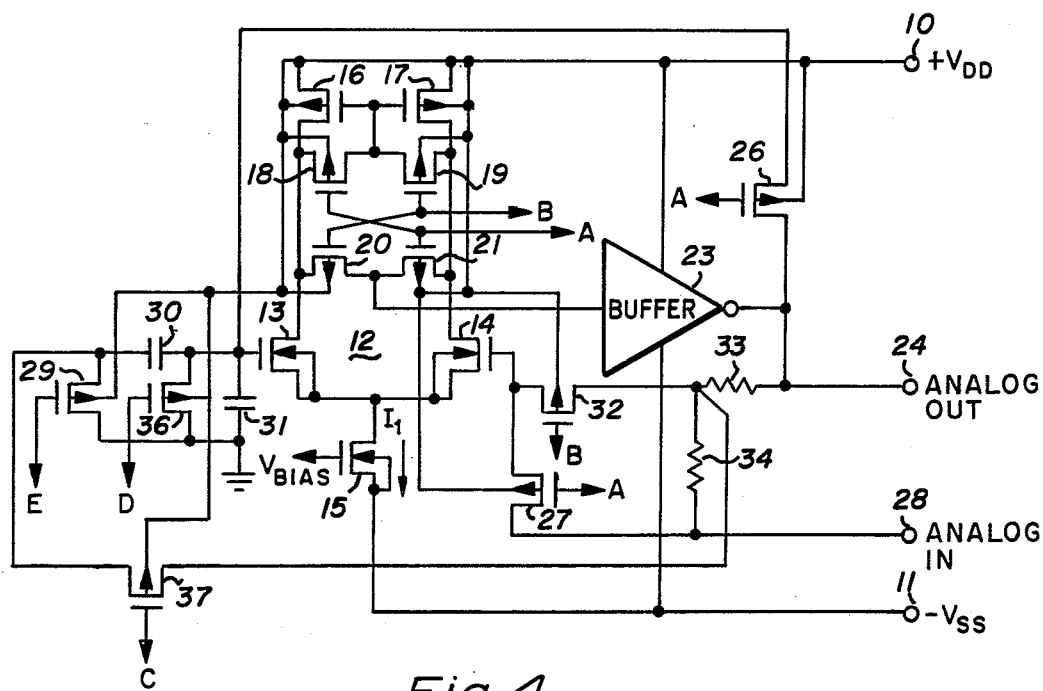
Fig_4
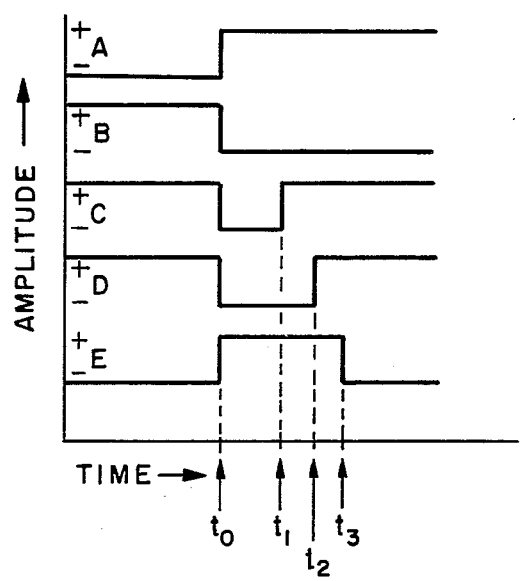
Fig_5

CMOS POLARITY SWITCH

BACKGROUND OF THE INVENTION

The invention relates to a reversible polarity signal transmission circuit operating under digital control. The circuits to be described employ complementary metal oxide semiconductor (CMOS) devices, which are well known in the art, and combine linear amplification with digital switching. The digital switch concept is shown in a design idea titled CMOS SWITCH INVERTS ANALOG SIGNAL UNDER CONTROL OF DIGITAL LOGIC, published in Electronic Design for Dec. 6, 1975, on page 92. CMOS is about ideal for such functions because it is capable of producing circuits that combine both digital and linear functions on a single monolithic integrated circuit (IC) chip.

One of the most common uses of such circuitry is in the implementation of digital-to-analog (D/A) converters and analog-to-digital (A/D) converters which are commonly used in the data acquisition/conversion functions associated with computers. While computers operate digitally the data they handle operates in analog fashion. Such convertors require a reference potential against which potentials to be converted are compared. In many cases a two-polarity reference source is required. It has become a common practice to develop a stable single-polarity reference and to pass it through an inverting buffer when the opposite polarity is required. This can most easily be accomplished using a switched buffer in which a digital control signal determines the output polarity.

While polarity switches are well known, they suffer from some drawbacks. The analog channels must be under digital control, but must remain free of digital switching pulse feed through. Also, the switching action, when reversing signal polarity, should be free of amplifier offset potential effects.

SUMMARY OF THE INVENTION

It is an object of the invention to provide means for compensating offset potential in an analog signal polarity switch.

It is a further object of the invention to switch the sense of a differential amplifier that is being switched digitally between an inverting and a noninverting configuration so that the offset effects are reduced.

It is a still further object of the invention to employ digital switching of an analog signal amplifier in which the switching also operates an offset cancellation circuit.

These and other objects are achieved, using CMOS circuitry that includes a linear differential amplifier. The amplifier is switched between unity gain inverting and noninverting configurations by means of a series of P channel enhancement type transistors. In the polarity switching operation the sense of the amplifier is also reversed thereby greatly reducing the effect of amplifier offset. If desired the offset effect can be still further reduced by employing a pair of capacitors in combination with additional switching transistors. In this mode of operation, after switching from the noninverting to the inverting configuration, an additional pulse sequence is generated to operate the additional switching devices. In a first brief interval, a capacitor is coupled across the amplifier input terminals where it is charged to the offset potential. Then the capacitor is disconnected and a second equal value capacitor connected between the noninverting input and ground for a second brief period. Then, during a third brief period, the charged capacitor is connected in parallel whereupon its charge is shared with the second capacitor. The charge sharing halves the potential which is applied to the amplifier noninverting input, where it will act to produce the same offset normally produced in the noninverting configuration. Then, due to the sense switching, the effect of offsets in the inverting and noninverting configurations will fully cancel. Since the compensation occurs in three brief periods immediately after the switching transition it will have minimal effect on the amplifier operation and will be effective in a matter of microseconds. The capacitors will hold their compensating charge until the sequence is repeated in the digital operation cycle.

BRIEF DESCRIPTION OF THE DRAWING

FIG. 1 is a schematic diagram of the basic circuit of the invention.

FIG. 2 is a pulse program showing the digital waveforms used to operate the circuit of FIG. 1.

FIG. 3 is a schematic diagram of the amplifier detail shown in block 23 of FIG. 1.

FIG. 4 is a modified version of the circuit of FIG. 1 in which offset cancellation is employed.

FIG. 5 is a pulse program showing the digital waveforms used to operate the circuit of FIG. 4.

DESCRIPTION OF THE INVENTION

With reference to FIG. 1, the circuit is operated from a power supply coupled between $+V_{DD}$ terminal 10 and $-V_{SS}$ terminal 11. Typically this supply will be symmetrical with respect to ground. For example $\pm 5$ volts may be employed to provide a 10-volt operation.

Input stage 12 provides a switchable differential operation that is controlled, using the waveforms of FIG. 2, in the following manner. N-Channel enhancement transistors 13–15 are connected with 13 and 14 operated differentially. Transistor 15 provides the tail current $I_1$. Enhancement load P-channel enhancement transistors 16 and 17 respectively act as load elements for transistors 13 and 14.

In the following discussion, it will be noted that the various switching functions are operated using conventional P-channel enhancement type transistors. For such a device, it will be conductive or ON when its gate is returned to $-V_{SS}$ level at terminal 11 and conductive or off, when its gate is returned to $+V_{DD}$ level at terminal 10. Thus, where the + and − switching polarities are shown in FIG. 2, it will be understood that + is OFF and − is ON.

Switching transistors 18–21 form a toggle for switching the signal transfer polarity of input stage 12. The gates of transistors 18 and 21 are coupled to waveform A while the gates of transistors 19 and 20 are coupled to waveform B. Transistors 20 and 21 will couple the drain of one of transistors 13 or 14 to a high gain inverter-buffer 23, the output of which provides the circuit output at terminal 24. Transistors 18 and 19 will act to switch either transistor 16 or 17 to a diode configuration for the current mirror load configuration of stage 12.

When terminal A is low and terminal B is high, as will be the case prior to (to the left of) $t_o$ in FIG. 2, transistors 18 and 21 will be ON, while transistors 19 and 20 will be OFF. For this condition, the gate of transistor 13 will represent the circuit inverting input with respect to terminal 24. The noninverting input is the gate of transistor 14.

Since the gates of transistors 26 and 27 are also coupled to waveform A, they too will be ON. Thus, output terminal 24 is coupled to the inverting input, while signal input terminal 28 is coupled to the noninverting input. In this condition, the circuit of FIG. 1 will act as a unity gain voltage follower.

At time $t_o$ the circuit toggles and will become an inverter. It will be noted that waveforms, A and B, reverse polarity thereby reversing all switch functions.

Switch 19 acts to diode connect transistor 17 and the drain of transistor 13 is coupled to buffer 23. This reverses the differential signal sense of stage 12. The gate of transistor 13 is now the noninverting input while the gate of transistor 14 is the inverting input. Waveform B turns switch 36 on which thereby grounds the noninverting input.

Resistors 33 and 34, which are a matched pair, are coupled in series between terminals 24 and 28. Their juncture is coupled via switch 32 to the amplifier inverting input as a consequence of waveform B. Since resistors 33 and 34 are of equal value, the gain from terminal 28 to terminal 24 will be unity and will be inverting.

In this configuration the matched resistors acting as a voltage divider produce double the offset voltage at output terminal 24.

In a practical situation the noninverting state will be used to buffer a positive reference voltage, $V_{REF}$ and the inverting state will be used to create a negative reference $-V_{REF}$. In both cases the magnitude of the output will be close to $V_{REF}$. However, where the buffer has an offset, $V_{OS}$, the noninverting output will be $V_{REF}+V_{OS}$. For the negative reference, where the device inverts, the output will be $-V_{REF}-2V_{OS}$. Using the prior art approach, the inverting configuration will produce an output of $-V_{REF}+2V_{OS}$. Using the invention, the $V_{OS}$ difference between states is one $V_{OS}$ as compared with the prior art difference of $3V_{OS}$. Thus by reversing the sense of the differential amplifier as the polarity is toggled, the change in offset is reduced by a factor of three to one. In many applications this improvement alone might be adequate for normal operation.

The circuit of FIG. 1 shows all p channel switching transistors. While such switches are fully adequate for positive analog signals they may not handle large negative analog signals properly. In this case the switches may be replaced with transmission gates which employ parallel connected complementary transistors. Transistors 26, 27, 32, and 36 could be paralleled by suitably gated N Channel transistors. In FIG. 4 the same comments will apply to switches 29 and 37 as well. In the event that the analog signals are all negative the above mentioned switches could all be of N channel construction. Since such gates and switching are well known in the CMOS art, they will not be discussed further herein.

Full offset compensation is achieved in the circuit of FIG. 4, using waveforms C, D, and E, of FIG. 5 in the following manner. Prior to $t_o$ the circuit operates as a unity gain voltage follower toggled by waveform A as described above. However, in this circuit waveform E turns switch 29 on so that capacitors 30 and 31 are coupled in parallel across the inverting input which is coupled to output terminal 24 by switch 26. Since buffer 23 is capable of driving a capacitive load, these capacitors will have little effect in this configuration. At $t_o$ the circuit is switched to the inverting configuration as described above. Also at $t_o$ waveform D applied to switch 36 turns it ON so as to ground the noninverting amplifier input. This also grounds the right-hand terminal of capacitor 30. The other terminal of capacitor 30 is returned via switch 37, which is turned on by waveform C, to the juncture of resistors 33 and 34 which comprises the amplifier inverting input. Time period $t_o-t_1$ is made long enough for capacitor 30 to fully charge to the amplifier offset potential. Since the R-C time constant is on the order of tens of nanoseconds, this period can be quite short. At $t_1$ waveform C turns switch 37 off which allows capacitor 30 to float and retain its charge.

At $t_2$ switch 36 turns off due to waveform D. This removes the short across capacitor 31. Then at $t_3$ waveform E turns switch 29 back on which in effect parallels capacitors 30 and 31. Since these capacitors are of equal value, the charge redistribution will halve and invert the original charge on capacitor 30. Therefore, at time $t_3$ capacitors 30 and 31, coupled in parallel, apply a potential of one half the inverted offset potential to the noninverting amplifier input. This will produce $V_{OS}$ at terminal 24. Since only leakage currents will discharge these capacitors, the compensating charge will persist for a considerable time. Since the digital switching action will operate more frequently than the time required for the capacitors to discharge appreciably, the compensating potential is effectively a d-c voltage that will persist during the inverting configuration.

As pointed out above, prior to $t_o$, when the switch is noninverting, the output will be $V_{REF}+V_{OS}$. After $t_o$ when one half of the offset voltage is inverted and applied to the amplifier input, the output will be $V_{REF}-V_{OS}$. Therefore, regardless of what the actual value of offset voltage it will produce no change in $V_{REF}$ magnitude when the circuit is toggled. This means that in the FIG. 4 configuration the effect of $V_{OS}$ is fully canceled.

It will be noted that at toggle time $t_o$ the switching waveforms are simultaneously applied to the various switches. At the gate of transistor 13 it can be seen that switches 26 and 36 have their gates driven by waveforms A and D respectively. Since these are out of phase, their feedthrough values will cancel. At the left-hand terminal of capacitor 30, which is coupled to the gate of transistor 13, switches 29 and 37 are driven by waveforms E and C respectively. Thus, their switching feedthrough will cancel too. Switches 27 and 32 are coupled to the gate of transistor 14 and are operated by waveforms A and B respectively. Again the switching feedthrough will be canceled. In view of the foregoing switching action, it can be seen that if the switching transistors are all made to have similar feedthrough characteristics, switching will not produce signal channel transients.

FIG. 3 shows the circuits of buffer inverter 23 of FIG. 1. Fundamentally the amplification is achieved using P-channel enhancement transistor 40 as an inverting amplifier stage driving an N-channel enhancement transistor 41 acting as a source follower.

P channel depletion transistor 42 acts as an active load for transistor 41 and is driven via current mirror action from transistor 43. Transistor 45 simulates transistor 41 and transistor 44 simulates transistor 42 so that the current flowing in transistor 46 simulates the current flowing in output transistor 41. This current is mirrored to vary the potential on node 47 which operates active depletion load transistors 42 and 44. This potential is nominally at ground potential which represents the amplifier quiescent bias.

Operating bias for the circuit is developed as $I_2$ which flows in resistor 48. This current flows in P channel transistor 49 whose gate is grounded to establish the quiescent bias voltae level. The same current flows in diode-connected N channel enhancement transistor threshold above $-V_{SS}$. This bias also turns on N channel enhancement transistors 51 through 53 as well as transistor 15 of FIGS. 1 and 4.

The current flowing in transistor 52 also flows in level shifter 54 and amplifier transistor 40. Capacitor 55 is a frequency response compensating element, acting to roll off amplifier gain with increasing frequency. P channel load transistor 56 acts as a resistor with capacitor 55 to control frequency compensation. Transistor 56 is biased by diode-connected P channel transistors 57 and 58 which are in turn biased by the current flowing in transistor 51.

EXAMPLE

The circuits of FIGS. 3 and 4 were constructed in conventional CMOS and operated in accordance with FIG. 2 waveforms. The power supply voltages were ±5 volts while the switching waveforms had the same values. The following component values were employed.

| COMPONENT | VALUE | UNITS |
| --- | --- | --- |
| Capacitors 30 and 31 | 5 | picofarads |
| Resistors 33 and 34 | 20K | ohms |
| Resistor 48 | 120K | ohms |
| Capacitor 55 | 10 | picofarads |

The following transistor sizes were employed.

| TRANSISTOR | W/L (microns) |
| --- | --- |
| 13, 14 | 144/8 |
| 15 | 58/10 |
| 16, 17 | 102/10 |
| 18 thru 21, 26, 27, 32 | 40/6 |
| 29, 36, 37 | 10/5 |
| 40 | 410/10 |
| 41, 45 | 540/6 |
| 42, 44 | 566/6 |
| 43, 46 | 200/6 |
| 49 | 100/6 |
| 50 | 58/10 |
| 51, 53 | 39/10 |
| 52 | 116/10 |
| 56 | 280/10 |
| 57 | 130/10 |
| 58 | 214/10 |

The circuit operated as a digitally controlled polarity switch in which the offset potential was substantially canceled so that it had no effect upon buffered reference voltages of both polarities.

The invention has been described and an operating example given. When a person skilled in the art reads the foregoing description, alternatives and equivalents will become apparent. Accordingly, it is intended that the scope of the invention be limited only by the following claims.

We claim:

1. In a polarity switch having a differential amplifier and digital control means for controlling the coupling of an analog signal wherein in one state said differential amplifier is connected as a unity gain voltage follower and in a second state said differential amplifier is connected as a unity gain inverter, the improvement comprising:

means responsive to said digital control means for reversing the sense of said differential amplifier whereby the effect of amplifier offset potential is reduced as a result of switching between said two states;

first and second capacitors;

means responsive to said digital control means for periodically coupling said first capacitor across the input terminals of said differential amplifier to develop a charge equal to the offset potential of said amplifier;

means responsive to said digital control means for connecting said first and second capacitors in parallel whereby the offset potential charge developed across said first capacitor is shared between the two capacitors thereby to develop a fraction of said offset potential; and means responsive to said digital control means for connecting said parallel combination of said first and second capacitors to said differential amplifier when connected as a unity gain inverter whereby the offset potential of said amplifier is compensated as a result of said switching.

2. The improvement of claim 1 wherein said first and second capacitors are equal and said fraction is ½.

3. The improvement of claim 1 wherein said differential amplifier in said unity gain inverter configuration is achieved by coupling a first resistor from output to inverting input and a second equal value resistor between said inverting input and said analog signal source.

4. The improvement of claim 1 wherein said differential amplifier in said unity gain voltage follower configuration has its output coupled to its inverting input and its noninverting input coupled to said analog signal source.

* * * * *